(12) United States Patent
Allison et al.

(10) Patent No.: US 8,130,045 B1
(45) Date of Patent: Mar. 6, 2012

(54) DIGITAL SELF EXCITED LOOP

(75) Inventors: Trent Allison, Yorktown, VA (US); Jean Delayen, Yorktown, VA (US); Curt Hovater, Seaford, VA (US); John Musson, Newport News, VA (US); Tomasz Plawski, Yorktown, VA (US)

(73) Assignee: Jefferson Science Associate, LLC, Newport News, VA (US)

( * ) Notice: Subject to any disclaimer, the term of this patent is extended or adjusted under 35 U.S.C. 154(b) by 1110 days.

(21) Appl. No.: 11/985,718

(22) Filed: Nov. 16, 2007

Related U.S. Application Data

(60) Provisional application No. 60/859,619, filed on Nov. 17, 2006.

(51) Int. Cl.
*H03L 7/00* (2006.01)
(52) U.S. Cl. ................ 331/6; 315/5.38; 250/396 R
(58) Field of Classification Search .............. 331/96, 331/6, 7; 324/318; 375/224
See application file for complete search history.

(56) References Cited

U.S. PATENT DOCUMENTS 6,462,489 B1 * 10/2002 Roberge et al. ............. 315/505
7,075,378 B2 * 7/2006 Howe et al. ................. 331/96

* cited by examiner

*Primary Examiner* — Arnold Kinkead

(57) ABSTRACT

A process that provides the ability to incorporate a self exciting loop (SEL) algorithm into a digital LLRF system. The present digital SEL provides for conversion from the Cartesian domain to the Polar domain, wherein most signal processing is accomplished, and back to Cartesian. By handling most signal processing in the Polar (phase & amplitude) domain, a perfect amplitude limiter can be realized and simpler logic operations can be used. When operational, cavity recovery from faults will be tuner-less. At high gradients, ~20 MV/m, like those needed for the upgraded cryomodules, the Lorentz detuning will be many bandwidths, making cavity turn-on problematic with out some tuner based compensation or other algorithmic solution. The present SEL solves this problem and allows cavity recovery from cryogenic trips, wherein cavities have been known to detune 1000's of Hz. Other applications such has He processing can also be implemented in situ without additional electronics.

11 Claims, 3 Drawing Sheets

Figure 1: SEL Block Diagram

DIGITAL SELF EXCITED LOOP

The subject matter in this application was originally disclosed in U.S. provisional patent application No. 60/859,619 filed on Nov. 17, 2006 and priority is claimed to the provisional application.

This invention disclosed herein was made with the aid of the U.S. Government and may be manufactured, used, licensed by or for the Government for any governmental purpose without the payment of any royalty thereon.

BACKGROUND OF THE INVENTION

The present invention relates generally to the field of signal processing and more specifically to a digital process that emulates an analog oscillator and ultimately a self excited loop (SEL).

A digital process has been developed that emulates an analog oscillator and a self excited loop (SEL) that can be used for field control. An SEL, in its analog form, has been used for many years for accelerating cavity field control. In essence the SEL uses the cavity as a resonant circuit, much like a resonant (tank) circuit is used to build an oscillator. An oscillating resonant circuit can be forced to oscillate at different, but close, frequencies to resonance by applying a phase shift in the feedback path. This allows the circuit to be phased-locked to a master reference, which is crucial for multiple cavity accelerators. For phase and amplitude control the SEL must be forced to the master reference frequency, and feedback provided for in both dimensions. The novelty of the present design is in the way digital signal processing (DSP) is structured to emulate an analog system. This is the first time that we know of the digital SEL concept has been designed and demonstrated for field control of superconducting accelerating cavities.

Presently the CEBAF Accelerator at Jefferson Lab is a 6 GeV five pass electron accelerator consisting of two superconducting linacs joined by independent magnetic transport arcs. In the future it is intended to increase the energy to 12 GeV. This is to be accomplished by adding five new 98 MeV cryomodules to each linac (10 total). To control the RF for these new cryomodules a new Low Level RF (LLRF) system is being designed. Cavity field control is maintained digitally using an Altera FPGA, which contains the feedback algorithm. The system incorporates digital down conversion, using quadrature under-sampling at an IF frequency of 70 MHz. A VME based system is being used as a prototype but it is planned to migrate to a stand alone EPICS IOC using a PC104 module.

Three upgrade cryomodules have been produced consisting of a new 7-cell cavity design and incorporating a new PZT mechanism. These cryomodules are discussed further in "Improved Prototype Cryomodule for the CEBAF 12 GeV Upgrade", by E. Daly, et al., PAC 2003 Proceedings, Portland, Oreg., which is incorporated herein by reference. Two of these upgrade modules have been tested and installed, one in the CEBAF accelerator and the other in the Jefferson Lab FEL. Initial LLRF testing was done last summer. In these tests digital LLRF control was demonstrated to meet field control requirements up to 16.7 MV/m. For these tests a simple Generator Driven Resonator (GDR) algorithm was used. Further discussion of these test results can be found in "High Gradient Operation with the CEBAF Upgrade RF Control System", by C. Hovater et al., LINAC 2006 Proceedings, Knoxville, Tenn., which also is incorporated herein by reference.

Self Excited Loop

The self excited loop was first presented by J. R. Delayen in "Phase And Amplitude Stabilization of Superconducting Resonators", PhD Thesis, California Institute of Technology, 1978, which is incorporated herein by reference, and has been used since for control of superconducting accelerator structures. The heavy ion accelerators at Argonne, JAEA Tokai, Canberra and the electron accelerator at Darmstadt both use an analog version of the SEL. It is principally used for structures operated continuous wave (CW), with external Q's above $1\times10^7$, but can be used for any resonant structure.

An SEL algorithm has one distinct advantage over a GDR, it immediately excites a cavity regardless of frequency. For a superconducting cavity (SC) that has a large Lorentz detuning coefficient this allows an RF system to recover a cavity to the operational gradient without having to tune the cavity. In a CW RF system this is optimum. Even if the cavity has been detuned many bandwidths, the frequency difference between the reference and the cavity can be obtained and the cavity quickly tuned back. This is accomplished without the use of hunting algorithms or employing a Numerically Controlled Oscillator (NCO) which GDR systems must use.

What is needed in the field is a digital self excited loop. The ideal system would allow implementation in an integrated circuit such as a full pin-grid array (FPGA).

SUMMARY OF THE INVENTION

A process that provides the ability to incorporate a self exciting loop (SEL) algorithm into a digital LLRF system. The present digital SEL provides for conversion from the Cartesian domain to the Polar domain, wherein most signal processing is accomplished, and back to Cartesian. By handling most signal processing in the Polar (phase & amplitude) domain, a perfect amplitude limiter can be realized and simpler logic operations can be used. When operational, cavity recovery from faults will be tuner-less. At high gradients, ~20 MV/m, like those needed for the upgraded cryomodules, the Lorentz detuning will be many bandwidths, making cavity turn-on problematic with out some tuner based compensation or other algorithmic solution. The present SEL solves this problem and allows cavity recovery from cryogenic trips, wherein cavities have been known to detune 1000's of Hz. Other applications such has He processing can also be implemented in situ without additional electronics.

It is an object of the present invention to provide a digitally controlled oscillating device that automatically tunes to the resonance of a cavity.

BRIEF DESCRIPTION OF THE DRAWINGS

The invention of the present application will now be described in more detail with reference to the accompanying drawings, given only by way of example, in which.

DETAILED DESCRIPTION OF THE INVENTION

Figure 1:
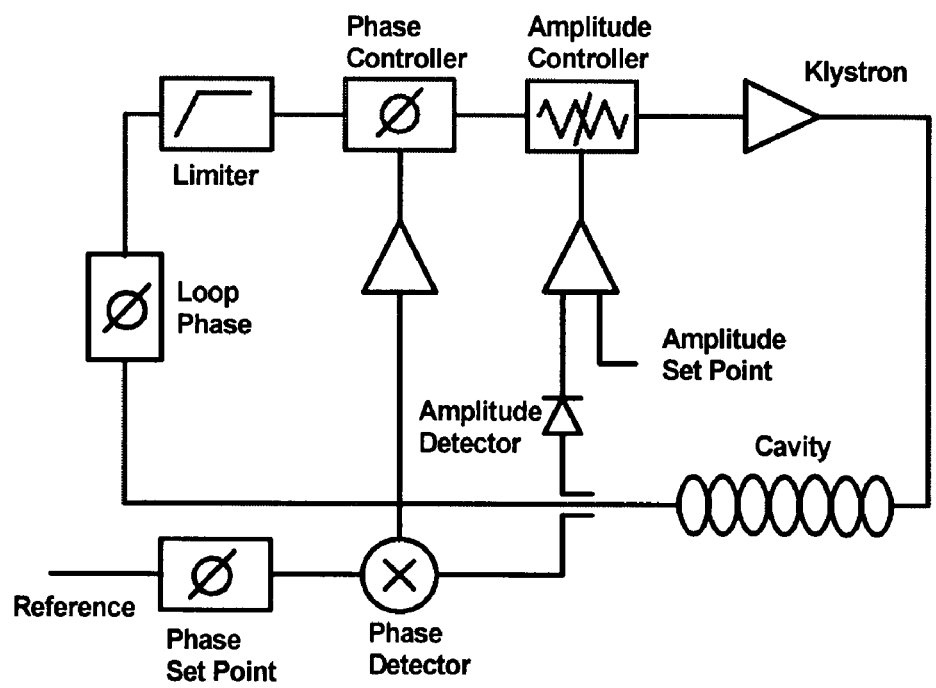
FIG. 1 is a block diagram of an analog self excited loop.

FIG. 1 shows a block diagram of an analog self excited loop (SEL). In its simplest form, an SEL is an oscillator (amplifier driving a resonant circuit) with positive feedback. In this form it will naturally track the cavity frequency given that the amplifiers bandwidth is sufficiently larger than the cavity bandwidth. Amplitude control is obtained by limiting the feedback amplitude and then providing an external set point, which can be compared to the cavity signal for additional amplitude control. The circuit can be phase-locked to a reference by comparing the cavity signal to the reference and feeding back into the SEL. The phase angle forces the loop frequency and phase to lock to the reference. This is best done adding a signal in quadrature instead of simply introducing a phase shift. The cavity frequency must be tuned close enough to the reference such that the amplifier does not saturate. Optimally, for RF power reasons, this is less than half a cavity bandwidth.

Conversion to Digital Domain

Figure 2:
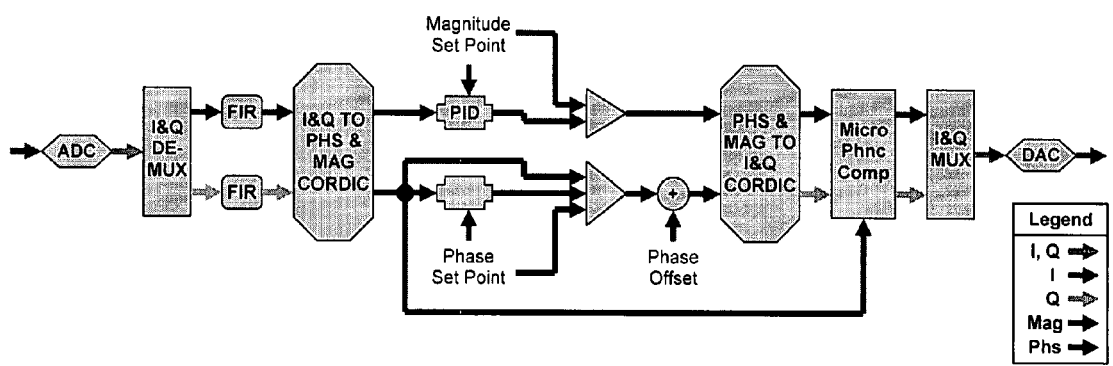
FIG. 2 is a block diagram of the preferred embodiment.

The idea of building a digital SEL has been tried before without success. The preferred embodiment, shown in FIG. 2, provides for direct digital conversion at an IF frequency of 70 MHz. All processing then occurs at a multiple of the clock frequency, 56 MHz. The limiter, phase controller and amplitude controller are the part in FIG. 1 that must be digitized. An SEL algorithm was developed on a modified normal conducting LLRF controller. It is a VME based digital controller consisting of an Altera FPGA. The algorithm was bench tested using a cavity simulator (crystal filter) that by frequency conversion mimicked a cavity with a $Q_{ext}$ of $10^6$.

One of the benefits of the present Digital SEL is the ability to go from the In-Phase & Quadrature (I & Q) domain to the phase & amplitude domain, and then back to I & Q. By doing this we were able to realize a perfect amplitude limiter, a necessity for a self excited loop to work properly. Use of a Coordinate Rotation Digital Computer (CORDIC) algorithm was key to this transformation. The CORDIC is an iterative algorithm that converts the signal from Cartesian (I & Q) to Polar (phase and amplitude). For signal processing, the phase and amplitude domain has the advantage of simpler logic operations, which is very important for a FPGA. Being in the phase and amplitude domain allows the firmware to handle a spinning vector, which an SEL must do when not locked. By passing the phase information through the FPGA and holding the amplitude constant, a frequency independent limiter is produced. The phase information passed back through the feed-forward path allows the system to track the frequency of the resonant circuit (LRC, microwave cavity, crystal etc.) similar to an analog phase-lock-loop. Maximum bandwidth is only limited by the filters in the receiver.

Initial efforts began as an extension of the Generator Driven Resonator (GDR) based system. The first task was to demonstrate a digital oscillator that would track a cavity. Given the discrete nature of a digital system there was some concern that the noise buildup needed for an oscillator to start would be hindered by the ADC resolution. In addition there was a strong bias to oscillate at the 70 MHz harmonic of the clock frequency not the cavity frequency. To do this the GDR system was programmed to pass the signal straight through. Loop phase was then adjusted with an external loop phase shifter. Results were positive and proved that a digital SEL was possible. Operating around a spare 499 MHz deflecting cavity we observed oscillation and upon detuning the cavity the frequency tracked.

The challenge to creating a digital SEL became coding a limiter and adding elements of phase and amplitude control. Given that the GDR based system was in the I & Q domain we started down this path. A SystemVue model was developed to guide the DSP effort and help with the FPGA logic design. The limiter effectively was a digital automatic gain controller. In addition a microphonic compensator was added after the limiter to correct for cavity detuning. The results proved that the concept would work (small control bandwidth and dynamic range). At this point we moved some of the digital signal processing out of the I/Q domain and into phase and amplitude, with the aid of the CORDIC, which converted the signal from Cartesian (I & Q) to Polar (phase and amplitude). By separating the magnitude and phase, the limiter function was easily realized.

FIG. 2 shows a block diagram of the preferred digital SEL control logic. After digitization, the cavity field signal is fed through FIR filters before the CORDIC. Once in this domain, the following operational modes can be obtained.

Figure 3:
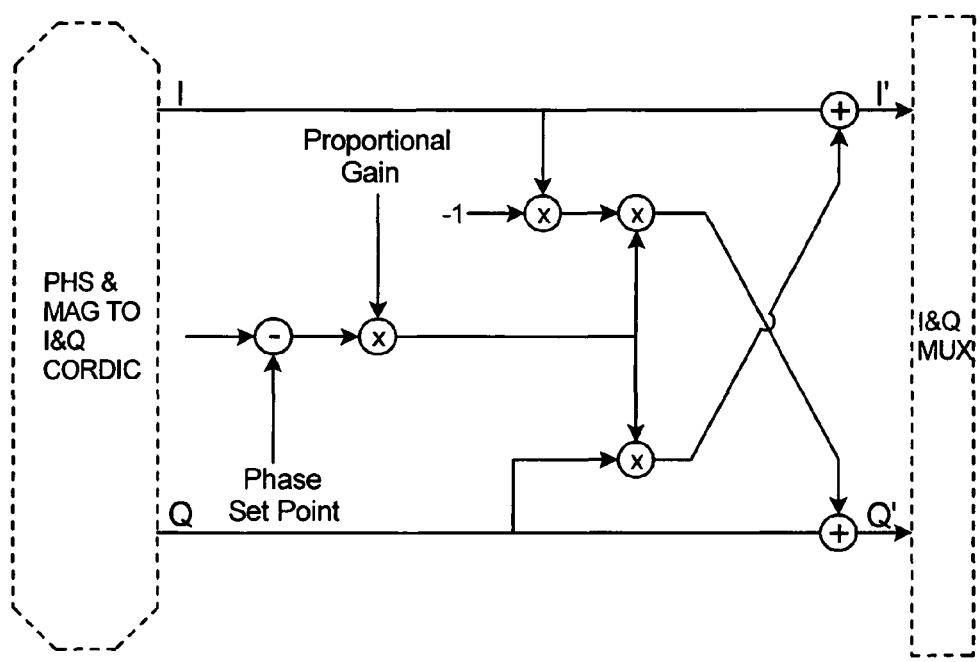
FIG. 3 is schematic for compensating for microphonics.

1. Tone: The simplest case is the straight forward tone. The Amplitude and Phase loop are open and amplitude control is through a set point. A tone is then generated at 1497 MHz frequency which is determined by the reference clock.
2. SEL: To switch to SEL mode the phase loop from the cavity is re-connected (feedback) and a loop phase shifter added. In this mode the loop resembles a PLL-VCO in that it tracks the cavity frequency. Amplitude control is the same as the tone-mode. Controlling the amplitude in this fashion has the effect of a perfect limiter.
3. Microphonics Compensation: FIG. 3 shows the method for compensating for microphonics using an SEL. By obtaining a phase error signal and applying it proportionally to the compensation algorithm in the I & Q domain the effect of microphonics on cavity field can be minimized. Gradient is adjusted similarly to the tone. For this to work the loop must be on resonance.
4. Amplitude Control: In this case a PID controller, is added in the amplitude feedback path. This can be operated in SEL or compensation mode.

After signal processing another CORDIC is used to bring the signals back into the I & Q domain. The signals are then passed through the microphonics compensator (on or off) and then through a MUX. Finally a single DAC processes the signal and generates the IF needed for up conversion to the cavity frequency.

Cavity Tests and Measurements

SC cavity tests were made on an upgrade cryomodule using the Jefferson Lab Free Electron Laser (FEL). We began measurements first at low power (~mV/m) and then at operational levels (~MV/m). For high power tests the existing LLRF system acted as the cavity interlocks. The drive and cavity signals were then routed to the digital system. Additionally a separate LO and clock were used making testing simpler.

In SEL mode, the system quickly found the cavity resonance. This was tested a number of ways. First the LO source was detuned +/−50 kHz while observing the cavity signal using a spectrum analyzer. The spectrum analyzer frequency never changed. Next the cavity was mechanical detuned by 1.3 kHz while observing the frequency. This time the frequency changed as the resonance frequency changed. Finally the LLRF system was turned off and the LO source detuned 10 kHz and turned back on. Again the system immediately found resonance.

In an SEL it is possible to achieve phase and gradient control using a microphonic compensator scheme that uses the phase error signal and applies a proportional amount to the I & Q vectors, see FIG. 3. Turning on the compensator and adjusting the proportional gain allowed us to reduce the phase error from 0.75° rms. to 0.11° rms error. This was measured using an Agilent Signal Source Analyzer. The error was dominated at the low frequency between 1-10 Hz by the Local Oscillator phase noise and is excluded in the measurement. In the CEBAF accelerator the master oscillator LO has lower phase noise and this should not be an issue. In SEL mode the cavity amplitude error was ~0.1% which was 3 times our target specification of 0.045% rms. This we believe is caused by system nonlinearities (amplifiers, mixers etc.). To achieve the required amplitude field control we applied a magnitude PID loop to the compensated SEL. By applying proportional control we were able to achieve our amplitude field control specification of 0.045%. Future tests are planned with enhanced operability, i.e., a resonance control algorithm to keep the cavity within 1 Hz of the reference.

The foregoing description of the specific embodiments will so fully reveal the general nature of the invention that others can, by applying current knowledge, readily modify and/or adapt for various applications such specific embodiments without departing from the generic concept. Therefore, such adaptations and modifications should and are intended to be comprehended within the meaning and range of equivalents of the disclosed embodiments. It is to be understood that the phraseology of terminology employed herein is for the purpose of description and not of limitation.

We claim:

1. A digitally controlled oscillating device that provides field control in a cavity, wherein signals are received in a Cartesian domain, converted to a Polar domain for signal processing, and then converted back to the Cartesian domain, the device comprising:
   an In-Phase and Quadrature de-modulator;
   a digital self excited loop that allows the device to automatically tune to a resonance of the cavity; and
   an In-Phase and Quadrature modulator.

2. The device of claim 1, wherein the digital self excited loop comprises:
   a coordinate rotation digital computer that is able to process a spinning vector.

3. The device of claim 1, wherein the digital self excited loop comprises:
   a digital limiter that is able to function as an automatic gain controller.

4. The device of claim 1, wherein the digital self excited loop comprises:
   a digital phase controller.

5. The device of claim 1, wherein the digital self excited loop comprises:
   a digital amplitude controller.

6. The device of claim 1, further comprising:
   a digital to analog converter; and,
   an analog to digital converter.

7. An oscillating device that can be used for field control in a cavity, the device comprising:
   at least one filter;
   a first coordinate rotation digital computer that converts in-phase and quadrature information into phase and magnitude information;
   at least one multiplexer that is able to accept a phase set point; and
   a second coordinate rotation digital computer that converts phase and magnitude information to in-phase and quadrature information.

8. The device of claim 7, wherein the device is able to operate in multiple modes, including tone, self-excited loop (SEL) and amplitude control.

9. The device of claim 8, wherein an amplitude loop and a phase loop are open, and amplitude control is through a set point when the device is operated in the tone mode.

10. The device of claim 8, further comprising a loop phase shifter, and wherein a phase loop is used as feedback and amplitude control is through a set point when the device is operated in the SEL mode.

11. The device of claim 8, further comprising:
    at least one proportional integral derivative (PID) that acts as a controller and is able to accept a magnitude set point.

* * * * *